United States Patent [19]

Higaki et al.

[11] Patent Number: 5,712,227
[45] Date of Patent: Jan. 27, 1998

[54] SUBSTRATE HAVING A SUPERCONDUCTOR LAYER

[75] Inventors: Kenjiro Higaki; Keizo Harada; Takashi Matsuura; Hitoshi Oyama; Hideo Itozaki; Shuji Yazu, all of Itami, Japan

[73] Assignee: Sumitomo Electric Industries, Ltd.

[21] Appl. No.: 378,895

[22] Filed: Jan. 25, 1995

Related U.S. Application Data

[63] Continuation of Ser. No. 180,395, Jan. 11, 1994, abandoned, which is a continuation of Ser. No. 908,597, Jun. 30, 1992, abandoned, which is a continuation of Ser. No. 547,723, Jul. 2, 1990, abandoned.

[30] Foreign Application Priority Data

| Jun. 30, 1989 | [JP] | Japan | 1-168677 |
| Jul. 24, 1989 | [JP] | Japan | 1-191014 |
| Dec. 27, 1989 | [JP] | Japan | 1-338916 |

[51] Int. Cl.⁶ ............................................ H01L 39/12
[52] U.S. Cl. ...................... 505/234; 505/235; 505/237; 505/238; 505/239; 505/701; 428/701; 428/702; 428/930
[58] Field of Search ............................. 505/234, 235, 505/236, 237, 238, 239, 190, 701, 702, 703, 704, 230, 231; 428/688, 689, 701, 702, 930

[56] References Cited

U.S. PATENT DOCUMENTS

| 4,885,273 | 12/1989 | Sugimoto | 505/1 |
| 4,948,779 | 8/1990 | Keur et al. | 505/701 |
| 4,983,575 | 1/1991 | Komuro | 505/1 |
| 5,034,378 | 7/1991 | Awaji | 505/702 |
| 5,057,484 | 10/1991 | Shiota | 428/688 |
| 5,084,438 | 1/1992 | Matsubara | 505/701 |
| 5,087,605 | 2/1992 | Hedge | 505/1 |
| 5,102,862 | 4/1992 | Okabe | 505/1 |
| 5,118,663 | 6/1992 | Woolf | 505/1 |
| 5,162,294 | 11/1992 | Talvacchio | 505/701 |
| 5,232,900 | 8/1993 | Bartur | 505/1 |
| 5,326,745 | 7/1994 | Nishino | 505/220 |

FOREIGN PATENT DOCUMENTS

| 301525 | 2/1989 | European Pat. Off. . |
| 301656 | 2/1989 | European Pat. Off. . |
| 306287 | 3/1989 | European Pat. Off. . |
| 308266 | 3/1989 | European Pat. Off. . |
| 0325877 | 8/1989 | European Pat. Off. . |
| 337699 | 10/1989 | European Pat. Off. . |

OTHER PUBLICATIONS

Patent Abstracts of Japan vol. 13, no. 110 (E-728)(3458) Mar. 16, 1989, & JP-A-63 283085 (Juichi Nishino) Nov. 18, 1988.

Patent Abstracts of Japan vol. 13, no. 173 (E-728) (3521) Apr. 24, 1989, & JP-A-01 003917 (Furukawa Electric Co. LTD) Jan. 09, 1989.

Geballe, "Paths to Higher Temp. Super" Science, vol. 259 Mar. 12, 1993 pp. 1550–1551.

"Engineer's Guide to High Temp Supercond," by Doss, pp. 106–109, Wiley & Sons, 1989.

Doss "Engineer's Guide to High T Superconductivity" 1989, pp. 267–269.

Chambonnet et al., in Journal of Less Common Metals 151 (1989) pp. 333–340.

Jap. Journ. Appl. Physics, vol. 27, No. 8, Aug. 1988, pp. L1492–L1494.

Vol. 27, No. 3 Jap. Journ. App. Physics, Mar. 1988, pp. L420–L422.

*Primary Examiner*—Marie Yamnitzky
*Attorney, Agent, or Firm*—Pennie & Edmonds LLP

[57] ABSTRACT

A substrate having a superconducting thin film of compound oxide thereon. An intermediate layer consists of at least one layer of copper-containing oxide is interposed between the substrate and the superconducting thin film.

2 Claims, 2 Drawing Sheets

SUBSTRATE HAVING A SUPERCONDUCTOR LAYER

This is a continuation of application Ser. No. 08/180,395, filed Jan. 11, 1994, now abandoned, which is a continuation of application Ser. No. 07/908,597, filed Jun. 30, 1992, now abandoned, which is a continuation of application Ser. No. 07/547,723, filed Jul. 02, 1990, now abandoned.

BACKGROUND OF THE INVENTION

1. Field of the Invention

The present invention relates to a substrate having a superconductor layer thereon. More particularly, the present invention relates to a substrate having an intermediate layer on which a superconductor layer is deposited.

2. Description of the Related Art

The superconductive phenomenon which is explained to be a kind of phase change of electrons was thought to be a phenomenon which can be observed under extremely low temperature. However, in 1986, Bednorz and Müller discovered a new oxide type superconductor [La, Sr]$_2$CuO$_4$ which shows superconductivity at 30 K (Z. Phys. B64, 1986 p 189). C. W. Chu et al. discovered another superconducting material of YBa$_2$Cu$_3$O$_{7-x}$ which shows the critical temperature of about 90 K in 1987 (Physical Review letters, Vol. 58, No. 9, p 908). Maeda et al discovered Bi-containing superconductor in 1988 (Japanese Journal of Applied Physics. Vol. 27, No. 2, p 1209 to 1210). In these newly discovered oxide superconductors, the superconductive phenomenon can be realized with relatively cheaper liquid nitrogen and hence the possibility of an actual utilization of the high Tc superconductors have burst onto the scene.

The above-mentioned oxide superconductors were prepared in a bulk form of sintered block by powder sintering technique. The sintered articles, however, shows very poor critical current density. In order to overcome this problem, a variety of deposition techniques have been studied to prepare thin films of these superconductors.

The superconductors of compound oxides can be deposited on a substrate such as SrTiO$_3$, MgO etc. by physical vapour deposition (PVD) including vacuum-deposition, sputtering, ion-plating, molecular beam epitaxy (MBE) and by chemical vapor deposition (CVD) technique such as MO-CVD.

Although remarkable improvement in the critical current density of these compound oxides have been achieved in their thin films, the conventional thin films of superconducting compound oxides are still insufficient to be used for fabricating actual electronics devices because the thin films are not homogeneous microscopically in addition to relatively lower critical current density. Therefore, there is a demand to develop a thin film, preferably a thin film of a single crystal of superconducting compound oxide which is deposited uniform in quality on a large area of a substrate and has an improved critical current density and which can be utilized in fabrication of a variety of electronics devices.

It is believed that the thin films of superconducting compound oxide deposited on an oxide substrate of single crystal such as MgO and SrTiO$_3$ have improved superconducting properties because of the following reasons:

Firstly, when a thin film of superconducting compound oxide is deposited directly on a substrate, elements of which the substrate is composed are apt to migrate or diffuse into the thin film of compound oxide, resulting in deterioration of superconducting properties. In the case of single crystal substrates of MgO and SrTiO$_3$ or the like, such disadvantage can be reduced.

Secondly, the thin films deposited on a predetermined plane of single crystal substrate of MgO and SrTiO$_3$ is easy to become oriented polycrystal or single crystal of superconducting compound oxide. In other words, thin films deposited on the single crystals substrate of MgO and SrTiO$_3$ can be grown epitaxially, so that the resulting thin film is composed of a single crystal or polycrystals whose crystalline directions are well-ordered. Still more, it is easy to control anisotropy which the superconductors of compound oxide exhibit.

However, as stated above, known thin films of compound oxides prepared by the conventional methods were not enough uniform in quality to be utilized in electronics devices, because of bad influence of uneven surface condition of the substrate and mismatch in lattice constant between crystals of superconducting compound oxide and crystals of substrate. The surface uniformity of the superconducting thin film deposited on these substrate may be spoiled because of the following reasons:

(1) The surfaces of single crystals of oxides are not smooth in atomic level even their surfaces are polished. In fact, their electron diffraction patters by RHEED are not streak patterns but are rather spotty patters.

(2) Unevenness of the thin film can be absorbed by a stress in the thin film at an early stage of film growth. This stress, however, is released when the film becomes thicker, resulting in unevenness of the thin film.

Usually, the thin films of superconducting compound oxides prepared by vapour deposition techniques are subjected to after-treatment or post-annealing because their superconducting properties "as deposited" are poor. It is also known that the quality of the thin film is sharply deteriorated in the neighborhood of the substrate owing to diffusion of elements of which the substrate are composed during the post-annealing.

U.S. Pat. No. 4,837,609 proposes to insert a layer of W, Mo or Ta between a superconducting compound oxide material and a silicon single crystal.

Japanese patent laid-open No. 63-239,840 proposes to oxidize a copper substrate to form a CuO layer thereon and then a superconducting compound oxide material is deposited on the CuO layer.

The present invention solves the problems of the known techniques and to provide a substrate having a superconductor layer which has a smooth smooth surface and which has improved superconducting properties and a process for preparing the same.

SUMMARY OF THE INVENTION

The present invention provides a substrate having a superconducting thin film of compound oxide thereon, having an intermediate layer which is interposed between the substrate and the superconducting thin film, characterized in that the intermediate layer consists of at least one layer of copper-containing oxide.

The substrate is preferably a single crystal substrate, particularly an oxide of MgO, SrTiO$_3$ or yttrium stabilized zirconia (YSZ).

The compound oxide of which the thin film is made can be any one of known superconducting compound oxides. Among them, followings are mentioned as preferable ones:

(1) Bismuth type superconductors:

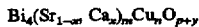

in which "x", "m", "n", "p" and "y" are numbers each satisfying ranges of $6 \leq m \leq 10$, $4 \leq n \leq 8$ $0<x<1$ and $-2 \leq y \leq +2$, respectively and $p=(6+m+n)$.

(2) YBCO type superconductors:

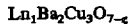

in which "Ln" stands for at least one element selected from a group comprising La, Nd, Sm, Eu, Gd, Dy, Ho, Y, Er, Tm, Yb and Lu, and "z" is a number satisfying a range of $0 \leq z<1$.

(3) "La" type superconductors:

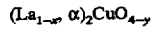

in which "α" stands for Sr or Ba, and "x" and "y" are numbers each satisfying respective range of $0 \leq x<1$ and $0 \leq y<1$.

Particularly, the present invention is advantageous when the Bi-type superconductor of (1) is used.

An essence of the present invention resides in that the intermediate layer comprises at least one copper-containing oxide layer. This copper-containing oxide layer can be layers made of one of following oxides:

(a) Copper-containing compound oxides having a crystal structure of perovskite type or layered perovskite type. For example, following compound oxides (I) and (II) are preferable:

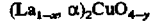 (I)

in which "α" stands for Sr or Ba, and "x" and "y" are numbers each satisfying respective range of $0 \leq x<1$ and $0 \leq y<1$, $Ln_1Ba_2Cu_3O_{7-z}$ (II)

in which "Ln" stands for at least one element selected from a group comprising La, Ce, Pr, Nd, Sm, Eu, Gd, Tb, Dy, Ho, Y, Er, Tm, Yb and Lu, and "z" is a number satisfying a range of $0 \leq z<1$.

(b) Two layers of a copper layer (on the side of substrate) and a copper oxide layer (on the side of superconducting thin film).

Both of the intermediate layer and the superconducting compound oxide layer can be prepared by any known conventional thin film forming techniques including physical vapour deposition such as vacuum deposition, sputtering, ion-plating, molecular beam epitaxial growth (MBE) and chemical vapour deposition such as MO-CVD. In these techniques, vaporized atom(s) and/or molecular(s) from a vapour source or sources are deposited on a single crystal substrate such as MgO, SrTiO₃ or YSZ.

FIRST EMBODIMENT

In the first embodiment of the present invention, the intermediate layer is made of oxide or compound oxide of copper having a crystal structure of perovskite type or layered perovskite type.

This first embodiment of the present invention is most effectively applicable to bismuth type superconducting compound oxide having a composition represented by the formula:

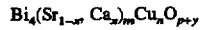

in which "x", "m", "n", "p" and "y" are numbers each satisfying ranges of $6 \leq m \leq 10$, $4 \leq n \leq 8$ $0<x<1$ and $-2 \leq y \leq +2$, respectively and $p=(6+m+n)$. Particularly, following compositions are preferable:

| (i) $7 \leq m \leq 9$, | $5 \leq n \leq 7$ | $0.4 < x < 0.6$ |
| (ii) $6 \leq m \leq 7$, | $4 \leq n \leq 5$ | $0.2 < x < 0.4$ |
| (iii) $9 \leq m \leq 10$, | $7 \leq n \leq 8$ | $0.5 < x < 0.7$ |

In this first embodiment, the intermediate layer is made preferably of one of following compound oxides (I) and (II):

 (I)

in which "α" stands for Sr or Ba, and "x" and "y" are numbers each satisfying respective range of $0 \leq x<1$ and $0 \leq y<1$,

 (II)

in which "Ln" stands for at least one element selected from a group comprising La, Ce, Pr, Nd, Sm, Eu, Gd, Tb, Dy, Ho, Y, Er, Tm, Yb and Lu, and "z" is a number satisfying a range of $0 \leq z<1$.

The substrate is preferably a single crystal substrate of MgO, SrTiO₃ or YSZ. Both of the intermediate layer and the superconducting compound oxide layer can be prepared by any known conventional thin film forming techniques including physical vapour deposition such as vacuum deposition, sputtering or ion-plating and chemical vapour deposition such as MO-CVD. It is also possible to use molecular beam epitaxial growth (MBE) or VPE in which monoatom layers are stratified successively on a substrate so that an interface between the intermediate layer and the superconducting thin film of compound oxide is composed of copper atom and oxygen atom.

Following advantages are expected by this first embodiment.

Namely, in the prior arts, it was very difficult to deposit epitaxially thin films of the above-mentioned superconducting Bi—Sr—Ca—Cu system compound oxides on a {100} plane of MgO single crystal by sputtering, vacuum deposition or MO-CVD, because mismatch in lattice constant between MgO and Bi—Sr—Ca—Cu system compound oxide which have a very high anisotropy. Still more, it was impossible to prevent formation of so-called "lower phase".

According to the first embodiment of the present invention, a lattice plane of Cu—O composed of copper atoms and oxygen atoms is formed on a surface of the substrate on which the superconducting thin film of compound oxide is to be deposited by depositing an intermediate layer of compound oxide of copper having a crystal structure of perovskite type or layered perovskite type. Since the lattice plane of Cu—O has high crystalline matchability with the bismuth type compound oxide, the thin film of bismuth-type compound oxide which is deposited on the intermediate layer can be grown epitaxially, resulting in improvement in the critical current density. The compound oxides (I) and (II) used as the intermediate layer are themselves superconductors. In this first embodiment, the compound oxides (I) or (II) grows easily and epitaxially on the substrate of MgO, SrTiO₃ or YSZ to produce a perovskite type or layered perovskite type crystal having Cu—O planes which contribute to superconduction and which are matchable with Cu—O plane of the bismuth type compound oxide. This epitaxial growth may be a reason of improvement in the critical current density.

In an example of the first embodiment, a typical superconducting thin film of YBa₂Cu₃O_y (hereinafter, YBCO) is formed on an intermediate layer composed of a compound oxide of La and Cu.

It is thought that crystal growth of YBCO thin film is governed inside thereof or depend on its own crystal structure. However, when the YBCO thin film is deposited directly on the substrate, the crystal of YBCO thin film which is effective to superconduction can be maintained after the post-anneal or after-treatment because mismatch in lattice constant between this YBCO thin film and a MgO single crystal which is a typical substrate material is 9.2% and elements of the substrate migrate or diffuse into the YBCO thin film during the post-anneal. In fact, the film forming-condition which is required to obtain a crystalline YBCO thin film is limited to a very narrow range.

According to the example of the present invention, a compound oxide layer La—Cu—O of La and Cu is formed firstly on the substrate, and then a superconducting thin film of compound oxide is formed on this La—Cu—O layer. This compound oxide layer La—Cu—O is a well-crystalline film and mismatch in lattice constant with YBCO thin film is about 2.4% which is lower than the mismatch with MgO, resulting in that a crystalline film of YBCO is formed easily. Still more, the superconducting property is less influenced by mutual diffusion of La from La—Cu—O and/or Y from YBCO because La and Y belong to same lanthanide elements.

Therefore, according to this embodiment, a well-crystalline YBCO thin film can be formed easily and a thickness of a superconducting layer is substantially increased, so that available or effective current density increase.

The thickness of the La—Cu—O layer is preferably higher than 100 Å in order to make it possible to produce a desired crystal structure and to prevent diffusion or migration of substrate material.

SECOND EMBODIMENT

In the second embodiment of the present invention, an intermediate layer or buffer layer consisting of two layers of a copper (Cu) layer and a copper oxide (Cu—O) layer (hereinafter, Cu/CuO buffer layer or Cu/CuO thin film) is interposed between a substrate and a superconducting thin film of compound oxide. In this case, a copper (Cu) layer is deposited on the substrate and the copper oxide (Cu—O) layer is deposited on this copper (Cu) layer. The superconducting thin film of compound oxide is deposited on this copper oxide (Cu—O) layer.

Both of the copper (Cu) layer and the copper oxide (Cu—O) layer are composed preferably of single crystal. The superconducting thin film of compound oxide is also preferably of single crystal.

The Cu/CuO buffer layer absorbs surface unevenness of the single crystal oxide substrate and absorbs or compensates difference in lattice constant between the substrate and the superconducting thin film of compound oxide. Therefore, the resulting superconducting thin film has a smooth surface of high quality.

This second embodiment is applicable to any known copper-containing oxide superconductor having Cu—O planes in its crystal structure including the following oxide systems: La—Sr—Cu—O system, Y—Ba—Cu—O system, Bi—Sr—Ca—Cu—O system and Tl—Ba—Ca—Cu—O system. Particularly, big advantageous effect is obtained in Bi—Sr—Ca—Cu—O system and Bi—Pb—Sr—Ca—Cu—O system including the following systems:

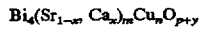

in which "x", "m", "n", "p" and "y" are numbers each satisfying ranges of $6 \leq m \leq 10$, $4 \leq n \leq 8$ $0<x<1$ and $-2 \leq y \leq +2$, respectively and $p=(6+m+n)$.

Following compositions are particularly preferable:

| | | |
|---|---|---|
| (i) $7 \leq m \leq 9$, | $5 \leq n \leq 7$ | $0.4 < x < 0.6$ |
| (ii) $6 \leq m \leq 7$, | $4 \leq n \leq 5$ | $0.2 < x < 0.4$ |
| (iii) $9 \leq m \leq 10$, | $7 \leq n \leq 8$ | $0.5 < x < 0.7$ |

The substrate is preferably a single crystal substrate of oxide such as MgO, $SrTiO_3$ or YSZ because these substrates facilitate epitaxial growth of the superconducting thin film of compound oxide thereon. The superconducting thin film is preferably deposited on {100} plane or {110} plane of these substrates.

Each Cu/CuO thin film of the buffer layer is preferably a thin film of a single crystal and has preferably a thickness between 10 Å and 1,000 Å, more preferably between 10 Å and 100 Å. Satisfactory advantage is not obtained when the thickness is not higher than 10 Å, while the crystalline structures of these thin films are disturbed in such manner that a bad influence is given to the resulting superconductive thin film when thickness exceeds 1,000 Å. The best crystalline structure which give superior results is obtained when each of Cu thin film and CuO thin film has a wall-thickness between 10 Å and 100 Å.

Following advantages are expected by this second embodiment.

(1) The superconducting thin film of compound oxide is easily grown epitaxially on the CuO thin film because the lattice constant of the CuO thin film is well matchable with that of the superconducting thin film of compound oxide. Namely, when the superconducting thin film of compound oxide is deposited on the CuO thin film, the crystal structure of the CuO thin film is well-reflected onto the crystal structure of the superconducting thin film of compound oxide, so that Cu—O planes which contribute superconductivity are formed in the superconducting thin film of compound oxide, resulting in that layered crystals are produced in the superconducting thin film of compound oxide.

(2) It is known that the bismuth type superconducting compound oxide has a layered crystal structure and diffusion of elements between Bi—O layers is relatively low. Because of this fact, Cu/CuO in the buffer layer does not diffuse into the bismuth type superconducting compound oxides, in other words stoichiometry of the superconducting thin film of compound oxide is maintained, even if the superconducting thin film of compound oxide is deposited on the CuO thin film.

(3) The Cu thin film grows easily epitaxially on the single crystal substrate. In fact, when the Cu thin film is observed by RHEED, a streak pattern which proves surface smoothness of the Cu thin film is observed. Then, the CuO thin film grows easily epitaxially on this Cu thin film and has a similar smooth surface.

Both of the Cu/CuO buffer layer and the superconducting compound oxide layer can be prepared by any known conventional thin film forming technique including molecular beam epitaxial growth (MBE), sputtering, ion beam sputtering and ion-plating.

Although special two embodiments according to the present invention are described, it is apparent that the present invention is easily applicable to the other type superconducting thin films of compound oxides.

In a summary, the substrate having a thin film of compound oxide superconductor according to the present invention improves in critical current density because the superconducting thin film well-grows epitaxially owing to an intermediate layer interposed between the superconducting thin film and the substrate and which can absorb mismatch in lattice constants. Still more, a well-crystallized superconducting thin film of compound oxide having a uniform wall thickness can be deposited stably and in a reproducible manner owing to reduced influence of migration or diffusion of elements of the substrate.

The superconducting thin film according to the present invention can be utilized advantageously in applications of Matisoo switching elements, Annaker memories, Josephson device, a variety of sensors or Superconducting Quantum Interference Device (SQUID) or the like.

Figure 1:
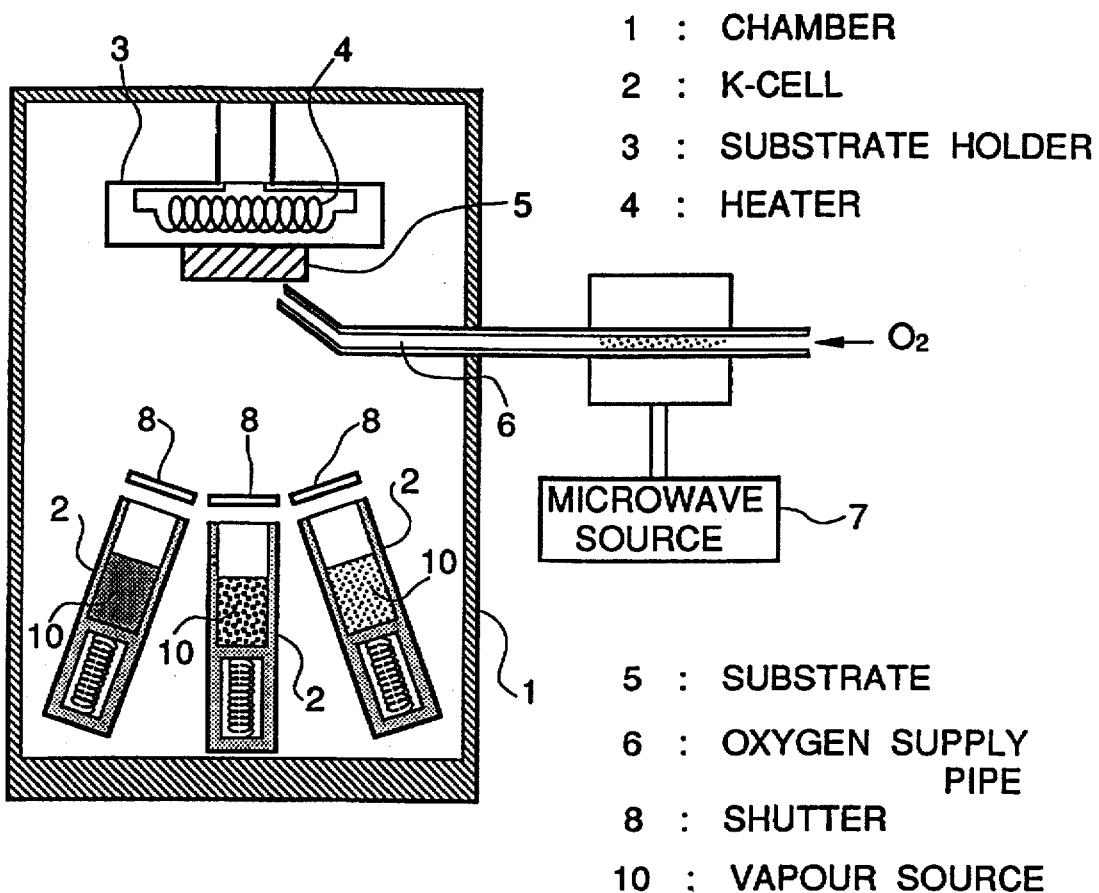
FIG. 1 illustrates an apparatus for depositing a thin film on a substrate which is used in an example of the present invention.

Now, the present invention will be described with reference to Examples, but the scope of the invention should not be limited to the Examples.

EXAMPLE 1

At first, an intermediate layer of a compound oxide of La—Sr—Cu system was deposited on a {100} plane of a $SrTiO_3$ single crystal substrate by RF (radio-frequency) sputtering under a film-forming condition shown in Table 1 (1). Then, a thin film of a superconducting compound oxide of Bi—Sr—Ca—Cu system was deposited by RF sputtering on the resulting intermediate layer under a film-forming condition shown in Table 1 (2).

TABLE 1 (1)

| Film-forming condition for the intermediate layer | |
| --- | --- |
| Composition of a target used: | La:Sr:Cu = 2.0:0.2:1.6 |
| Sputtering gas: | Ar + $O_2$ |
| $O_2$/Ar + $O_2$: | 0.2 (volume ratio) |
| Sputtering gas pressure (Torr): | $2 \times 10^{-2}$ |
| Substrate temperature (°C.): | 800 |
| RF-frequency power: | 50 W |
| | 0.64 W/cm$^2$ |
| Thickness of film (Å): | 2,000 |

Table 1 (2)

| Film-forming condition for the superconductor layer | |
| --- | --- |
| Composition of a target used: | Bi:Sr:Ca:Cu = 2.6:2.0:2.0:3.0 |
| Sputtering gas: | Ar + $O_2$ |
| $O_2$/Ar + $O_2$: | 0.2 (ratio in volume) |
| Sputtering gas pressure (Torr): | $2 \times 10^{-2}$ |
| Substrate temperature (°C.): | 750 |
| RF-frequency power: | 50 W |
| | 0.64 W/cm$^2$ |
| Thickness of film (Å): | 4,000 |

As a comparative example, another superconductor layer was deposited directly on a $SrTiO_3$ single crystal substrate under the same film-forming condition as is shown in Table 1 (2).

The resulting samples of the present invention and of the comparative example were subjected to post-annealing which was effected by the steps of heating the samples up to 890° C. at a rate of 3° C./min in an oxygen stream, maintaining the samples at 890° C. for one hour, and then cooling down to room temperature at a rate of 3° C./min.

The samples had following compositions (atomic ratio):
Intermediate layer: La:Sr:Cu=1.85:0.15:1
Thin film layer of superconductor: Bi:Sr:Ca:Cu=2:2:2:3

The samples were evaluated by measuring the critical temperature "Tc" and the critical current density "Jc". The results are shown in Table 2.

TABLE 2

| | Invention | comparative |
| --- | --- | --- |
| Critical temperature (K.) | | |
| Tco [1] | 115 | 115 |
| Tci [2] | 96 | 98 |
| Critical current density (A/cm$^2$) [3] | $7.5 \times 10^5$ | $1.2 \times 10^4$ |

(note)
[1]: a temperature where resistance started to drop.
[2]: a temperature from which resistance could not be measured
[3]: at 77 K.

Table 2 reveals that higher critical current density is obtained in the sample according to the present invention without spoiling the other properties.

The crystal structure of the samples were evaluated by an electron diffraction analyzer to find that the superconducting thin film in the sample of the present invention grow epitaxially.

EXAMPLE 2

In this example, a vacuum deposition technique was used. A plurality of vapour sources were energized simultaneously. At first, an intermediate layer of compound oxide of Y—Ba—Cu system was deposited on a {100} plane of MgO single crystal substrate and then a superconducting compound oxide of Bi—Sr—Ca—Cu system was deposited on the resulting intermediate layer.

As the vapour sources, commercially available metallic Y, Bi, Ca, Cu and fluorides of $BaF_2$ and $SrF_2$ were used. Metal elements were evaporated by means of K-cells while $BaF_2$ and $SrF_2$ were evaporated by electron guns. Table 3 (1) and (2) show film forming conditions.

TABLE 3 (1)

| Film-forming condition for the intermediate layer | |
| --- | --- |
| Partial pressure of oxygen (Torr): | $2 \times 10^{-5}$ |
| Substrate temperature (°C.): | 700 |
| Film-forming speed (Å/sec): | 5 |
| Thickness of film (Å): | 2,000 |

TABLE 3 (2)

| Film-forming condition for the superconductor layer | |
| --- | --- |
| Partial pressure of oxygen (Torr): | $2 \times 10^{-5}$ |
| Substrate temperature (°C.): | 750 |
| Film-forming speed (Å/sec): | 5 |
| Thickness of film (Å): | 4,000 |

As a comparative example, another superconductor layer was deposited directly on a MgO single crystal substrate under the same film-forming condition as is shown in Table 3 (2).

The resulting samples of the present invention and of the comparative example were subjected to post-annealing which was effected by the steps of heating the samples up to 890° C. at a rate of 3° C./min in an oxygen stream, maintaining the samples at 890° C. for one hour, and then cooling down to room temperature at a rate of 3° C./min.

The samples had following compositions (atomic ratio):

Intermediate layer: Y:Ba:Cu=1:2:3

Thin film layer of superconductor: Bi:Sr:Ca:Cu=2:2:2:3

The samples were evaluated by measuring the critical temperature "Tc" and the critical current density "Jc". The results are shown in Table 4.

TABLE 4

|  | Invention | comparative |
|---|---|---|
| Critical temperature (K.) | | |
| Tco [1] | 112 | 113 |
| Tci [2] | 90 | 95 |
| Critical current density (A/cm$^2$) [3] | $5.4 \times 10^5$ | $7.7 \times 10^3$ |

(note)
[1]: a temperature where resistance started to drop.
[2]: a temperature from which resistance could not be measured
[3]: at 77 K.

Table 4 reveals that very higher critical current density is obtained in the sample according to the present invention.

The crystal structure of the samples were evaluated by an electron diffraction analyzer to find that the superconducting thin film in the sample of the present invention grow epitaxially.

EXAMPLE 3

A superconducting thin film of compound oxide according to the present invention of $Bi_2Sr_2Ca_2Cu_3O_x$ was deposited on a {100} plane of a MgO single crystal substrate by a molecular beam epitaxy (MBE) unit illustrated in FIG. 1.

The MBE unit shown in FIG. 1 comprises a chamber 1 interior of which is evacuated to very high vacuum, a plurality of Kunudsen Cells (K-cells) 2 each of which can control a temperature of a vapour source 10 placed therein, a plurality of shutters 8 for controlling the amount or timing of each vapour source 10, a substrate holder 3 provided with a heater 4 for heating a substrate 5, and an oxygen gas supply pipe 6 through which oxygen excited by microwave discharge supplied from a microwave source 7.

At first, a thin film of copper (Cu) was deposited on the {100} plane of MgO single crystal substrate under the following conditions:

| Vapour source: | Cu |
|---|---|
| Temperature of the vapour source: | 1,400° C. |
| Substrate temperature: | 500° C. |
| Deposition rate: | 0.5 Å/sec |
| Pressure in the chamber: | $1 \times 10^{-8}$ Torr |
| Thickness: | 40 Å |

The resulting thin film of Cu was observed by RHEED to showed a streak pattern which revealed that the Cu thin film is an epitaxial film of good quality.

Then, a thin film of CuO was deposited on the Cu film under the following conditions:

| Vapour source | Cu |
|---|---|
| Temperature of the vapour source | 1,400° C. |
| Substrate temperature | 500° C. |
| Deposition rate | 0.5 Å/sec |
| Power of microwave generator | 100 W |
| Partial oxygen pressure | $5 \times 10^{-6}$ Torr |
| Thickness | 20 Å |

Finally, a thin film of $Bi_2Sr_2Ca_2Cu_3O_x$ was deposited on the CuO layer in the same chamber as above under the following conditions:

| Vapour sources and temperatures thereof | Bi: 530° C., Sr: 900° C. |
|---|---|
| | Ca: 950° C. Cu: 1,400° C. |
| Substrate temperature | 700° C. |
| Deposition rate | 0.5 Å/sec |
| Power of microwave generator | 100 W |
| Partial oxygen pressure | $5 \times 10^{-6}$ Torr |
| Thickness | 500 Å |

Figure 2:
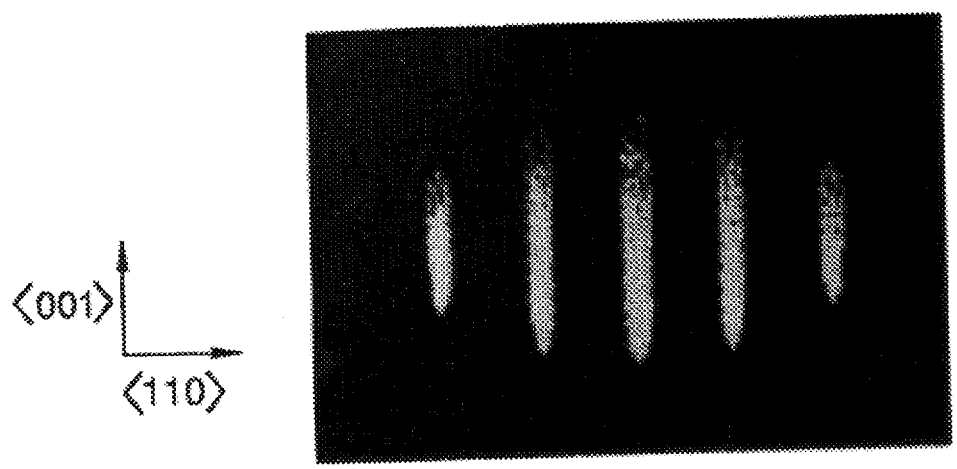
FIG. 2 is a RHEED pattern of a thin film of $Bi_2Sr_2Ca_{n-1}Cu_nO_x$ which was grown to a thickness of 500 Å in the example according to the present invention.

FIG. 2 is an electron diffraction pattern of the resulting superconducting thin film. The diffraction pattern is streaky which revealed that the superconducting thin film is a single crystal having a smooth surface.

As a comparison, another thin film of $Bi_2Sr_2Ca_2Cu_3O_x$ was deposited directly on a {100} plane of a CuO layer under the same condition as above, namely no Cu/CuO buffer layer was interposed.

The superconducting properties of the resulting superconducting thin films according to the present invention and of the comparative example were determined. The results are summarized in the following table.

|  | Invention | comparative |
|---|---|---|
| Critical temperature (K.) (a temperature from which resistance could not be measured) | 106 | 93 |
| Critical current density (A/cm$^2$) (at liquid nitrogen temperature) | $3.8 \times 10^6$ | $1.3 \times 10^4$ |

EXAMPLE 4

At first, a thin film of an oxide of La—Cu was deposited on a {100} plane of a MgO single crystal substrate having a diameter of 15 mm by RF (radio-frequency) sputtering under a film-forming condition shown in Table 4 (1). Then, a thin film of an oxide of Y—Ba—Cu system was deposited by RF sputtering on the La—Cu oxide layer under a film-forming condition shown in Table 4 (2) to prepare a sample 1.

A comparative sample 2 was prepared by depositing the thin film of an oxide of Y—Ba—Cu directly on a MgO single crystal substrate under the same film-forming condition as is shown in Table 4 (2).

TABLE 4 (1)

| Film-forming condition for a La—Cu oxide layer | |
|---|---|
| Composition of a target used | La: Cu = 2.0:1.6 |
| Sputtering gas | Ar + $O_2$ |
| $O_2$/Ar + $O_2$ | 0.2 (volume ratio) |
| Sputtering gas pressure (Torr) | 4 × $10^{-2}$ |
| Substrate temperature (°C.) | 800 |
| RF-frequency power | 50 W |
|  | 0.64 W/$cm^2$ |
| Thickness of film (Å) | 2,000 |

TABLE 4 (2)

| Film-forming condition for a Y—Ba—Cu oxide layer | |
|---|---|
| Composition of a target used | Y:Ba:Cu = 1.0:2.0:4.0 |
| Sputtering gas | Ar + $O_2$ |
| $O_2$/Ar + $O_2$ | 0.2 (ratio in volume) |
| Sputtering gas pressure (Torr) | 2 × $10^{-2}$ |
| Substrate temperature (°C.) | 650 |
| RF-frequency power | 50 W |
|  | 0.64 W/$cm^2$ |
| Thickness of film (Å) | 4,000 |

The resulting samples of the present invention and of the comparative example were subjected to post-annealing which was effected by the steps of heating the samples up to 900° C. at a rate of 3° C./min in an oxygen stream, maintaining the samples at 900° C. for one hour, and then cooling down to room temperature at a rate of 3° C./min.

The samples were evaluated by measuring the critical temperature "Tco and Tci" and the critical current density "Jc". The results are shown in Table 5.

TABLE 5

|  | Invention (Sample 1) | comparative (Sample 2) |
|---|---|---|
| Critical temperature (K.) * | | |
| Tco | 90 | 88 |
| Tci | 87 | 86 |
| Critical current density ** (A/$cm^2$) | 1.4 × $10^6$ | 2.8 × $10^4$ |

(note)
(*): "Tco" is a temperature where resistance started to drop. "Tci" is a temperature from which resistance could not be measured
(**): determined at 77 K.

Table 5 reveals that higher critical current density is realized in the sample 1 according to the present invention without spoiling the other properties.

The crystal structure of the samples were evaluated by an electron diffraction analysis to find that the superconducting thin film in the sample 1 according to the present invention grow epitaxially while the superconducting thin film of the comparative sample 2 did not grow epitaxially.

From the examples, it was confirmed that superconducting thin films of compound oxides having high critical current density can be produced in a reproducible manner.

We claim:

1. A composite comprising a single crystal substrate of MgO, a superconducting thin film of compound oxide and an intermediate layer which is interposed between and contacting the substrate and the oxide superconducting thin film, wherein said superconducting thin film of compound oxide has a composition represented by the formula:

$$Bi_4(Sr_{1-x} Ca_x)_m Cu_n O_{p+y}$$

in which "x", "m", "n", "p" and "y" are numbers each satisfying ranges of 6≦m≦10, 4≦n≦8, 0<x<1 and −2≦y≦+2, respectively and p=(6+m+n), and said intermediate layer has a composition represented by a formula:

$$Y_1Ba_2Cu_3O_{7-z}$$

in which "z" is a number satisfying a range of 0≦z<1, wherein said bismuth superconducting thin film is epitaxially deposited on said yttrium intermediate layer.

2. The composite of claim 1, wherein said intermediate layer has a perovskite or layered perovskite crystal structure.

* * * * *